United States Patent [19]

Huang et al.

[11] Patent Number: 5,034,687
[45] Date of Patent: Jul. 23, 1991

[54] SIGNATURE INDICATING CIRCUIT

[75] Inventors: Eddy C. Huang, San Jose; Kenneth R. Smits, San Ramon, both of Calif.

[73] Assignee: VLSI Technology, Inc., San Jose, Calif.

[21] Appl. No.: 422,256

[22] Filed: Oct. 16, 1989

[51] Int. Cl.⁵ .................... G01R 31/02; G01R 31/28
[52] U.S. Cl. ........................ 324/158 R; 324/73.1; 371/21.1; 371/15.1
[58] Field of Search .................. 324/73.1, 158 R, 509, 324/551, 550; 371/20.1, 15.1, 27, 20.2, 22.4, 22.5, 21.1, 21.2

[56] References Cited

U.S. PATENT DOCUMENTS

| 4,625,162 | 11/1986 | Bosnyak | 324/551 |
| 4,638,243 | 1/1987 | Chan | 324/509 |
| 4,687,989 | 8/1987 | Davis et al. | 324/158 R |
| 4,714,876 | 12/1987 | Gay et al. | 324/158 R |
| 4,743,841 | 5/1988 | Takeuchi | 324/158 R |
| 4,779,041 | 10/1988 | Williamson, Jr. | 324/158 R |
| 4,835,458 | 5/1989 | Kim | 324/158 R |
| 4,853,628 | 8/1989 | Gouldsbery et al. | 324/158 R |

Primary Examiner—Kenneth Wieder
Assistant Examiner—Vinh P. Nguyen
Attorney, Agent, or Firm—Majestic, Parsons, Siebert & Hsue

[57] ABSTRACT

A circuit for testing signatures at a pin in a CMOS device where this device is operable when it is powered by a voltage within the predetermined range. During the test mode, a task voltage whose magnitude is below that of any voltage in the operating range as applied so that parasitic diode turn-on is prevented.

18 Claims, 2 Drawing Sheets

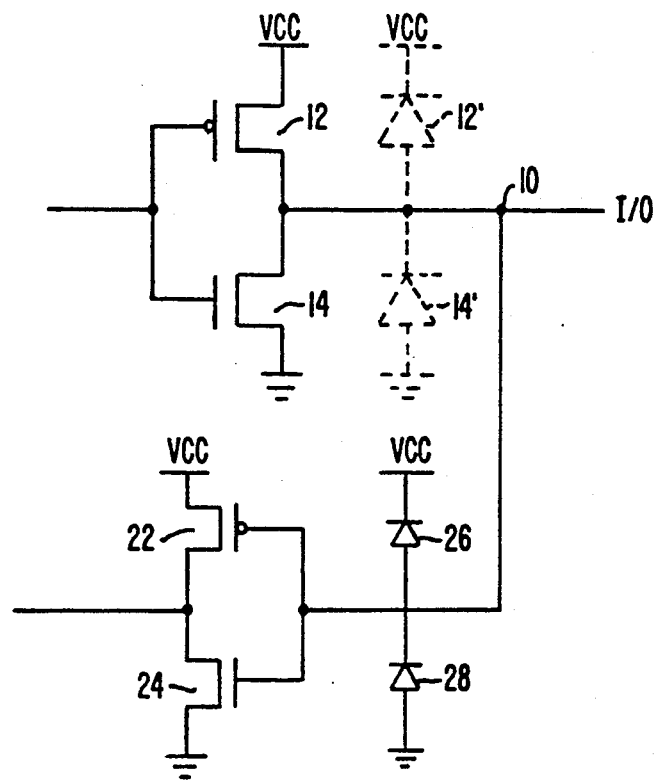
FIG._1.
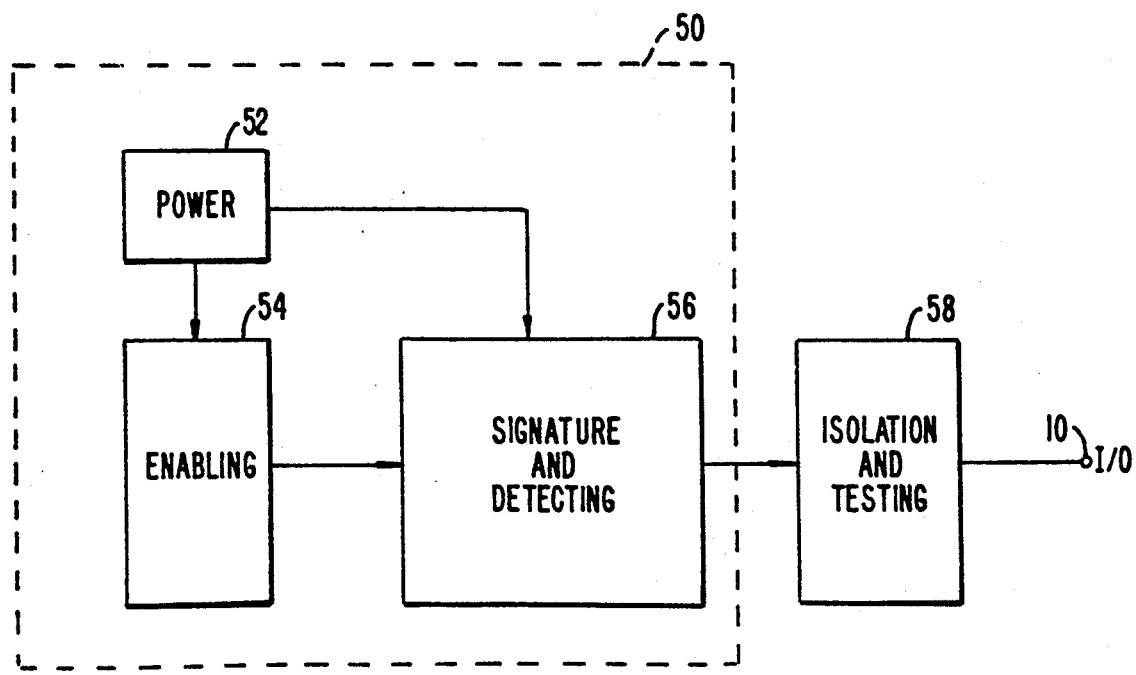
FIG._2.

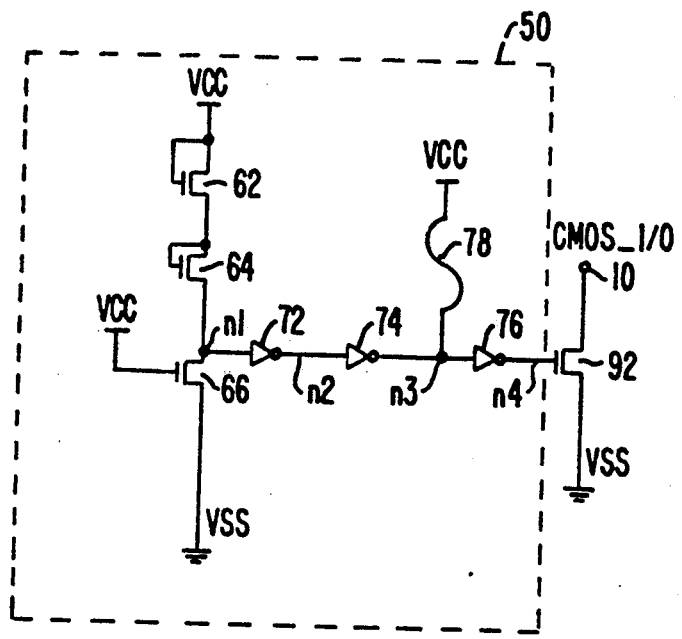
FIG._3.
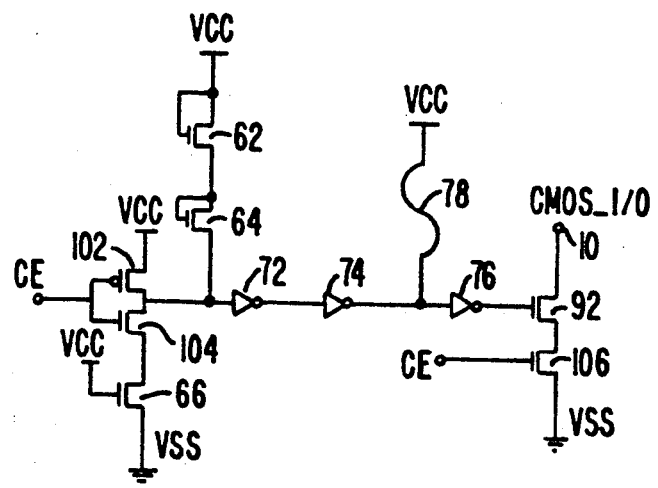
FIG._4.

SIGNATURE INDICATING CIRCUIT

BACKGROUND OF THE INVENTION

This invention relates in general to circuits for indicating signatures in a device and in particular to a circuit for indicating signature at a pin in the device where the pin is connected in parallel to a p-type diode and an n-type diode.

Due to manufacturing imperfections, integrated circuit dies sometimes contain malfunctioning cells. In anticipation of this, circuit designers have provided redundant cells. The die can then be repaired by programming so that a spare cell is used instead of a malfunctioning cell to carry on the desired functions of the die. The repair is usually carried out by means of lasers. Where certain cells malfunction after usage, cell redundancy allows the die to be repaired in the same manner.

After a die has been repaired, it is frequently important to be able to identify such die as one that has been repaired and distinguish it from one which has not been repaired. For this reason, conventional circuit design for integrated circuits employs signature circuits on the die to provide the means for distinguishing between the two types of dies. A typical signature circuit may include one or more fuses which are broken when the die has been repaired. Thereafter the signature circuit provides an output which is different from that provided by the circuit before the fuse was blown. By detecting the output of the signature circuit, it is possible to detect whether the die has been repaired or not. The fuses can be broken using lasers.

Integrated circuits are normally operated by applying voltages in a certain predetermined voltage range known as the operating range. In NMOS integrated circuits, for example, the circuits are normally tied to VCC and VSS voltage rails, where the voltage VCC of the first rail is within the predetermined voltage range. In NMOS integrated circuits, it is customary to apply a voltage to the circuit which is above that of the rail at VCC in order to detect the output of the signature circuit. The voltage applied to test the output of the signature circuit is much higher than the operating range of the circuit; such high voltages will stress the integrated circuit die and is undesirable.

Furthermore, the above-described method of applying high voltages to detect the signature circuit output is not feasible in CMOS-type integrated circuits. In CMOS-type circuits, the output of the signature circuit is typically connected to the output of complementary pair or pairs of p-type and n-type transistors. As will be explained in more detail below, such diodes may be real diodes or parasitic ones. Therefore, when a high voltage of either polarity is applied to an input/output pin of the signature circuit, the high voltage causes diode (real or parasitic) turn-on between the pin and the VCC power supply for the circuit. Such diode turn-on may cause latch-up which is undesirable.

The conventional systems for testing the signature of integrated circuits are not entirely satisfactory. Therefore, it is desirable to provide an improved signature circuit suitable for CMOS-type integrated circuits or any circuit whose signature testing pin is connected in parallel to a p-type diode and an n-type diode.

SUMMARY OF THE INVENTION

This invention is directed towards a circuit for indicating signatures at a pin in a device. The device is operable when it is powered by a voltage within a predetermined range which defines the operating range. The pin is connected in parallel to a p-type diode and an n-type diode, where the diodes may be real or parasitic. The circuit comprises power supply means, signature setting and detecting means connected to the pin and an enabling means. The enabling means enables the signature and detecting means to detect the logic state of the pin in the test mode. During the test mode, the power supply means supplies to the enabling means a test voltage whose magnitude is below that of any voltage in the operating range, so that the diodes are prevented from being turned on.

By applying a test voltage whose magnitude is below that of any voltage in the operating range, parasitic diode turn-on is prevented. Furthermore, by applying a low test voltage, the device is not stressed.

BRIEF DESCRIPTION OF THE DRAWINGS

FIG. 1 is a schematic view of a portion of a CMOS-type integrated circuit with a pin to illustrate parasitic diode turn-on and turn-on of diodes employed for electrostatic discharge protection.

FIG. 2 is a block diagram of a circuit for indicating signatures at a pin to illustrate the invention.

FIG. 3 is a schematic view of a circuit for indicating signatures to illustrate one implementation for the circuit of FIG. 2.

FIG. 4 is a schematic view of a circuit for indicating signatures to illustrate a second implementation for the circuit of FIG. 2.

DETAILED DESCRIPTION OF THE INVENTION

FIG. 1 is a schematic view of a portion of a CMOS device to illustrate the parasitic diode turn-on at an input/output (I/O) pin when a high voltage is applied to the pin. As shown in FIG. 1, pin 10 is the output pin for a complementary pair of transistors 12, 14. When a voltage much higher than the rail voltage VCC is applied to pin 10, this causes parasitic diode turn-on in transistor 12. In such circumstances, transistor 12 is equivalent to diode 12' shown in dotted lines in FIG. 1. Similarly, if a negative high voltage is applied at pin 10, parasitic diode turn-on is caused in transistor 14, in which case transistor 14 is equivalent to diode 14' shown in dotted lines in FIG. 1. Therefore, if the conventional signature testing system is applied where a high voltage is applied to pin 10, this causes parasitic diode turn-on in the device. This may adversely affect the operations of the device. In addition, the parasitic diode turn-on may render the signature testing either inaccurate or impossible. For these reasons, it is desirable to provide a signature testing system where no high voltage needs to be applied to the pin.

It will be noted from FIG. 1, however, that where pin 10 is used as an input pin, in order to protect the transistors 22, 24 from electrostatic discharge, an actual pair of diodes 26, 28 is usually employed as shown in FIG. 1. Hence, a high voltage applied to pin 10 causes either parasitic diode turn-on or turn-on of real diodes employed for electrostatic discharge protection.

FIG. 2 is a block diagram of a circuit for indicating signatures to illustrate the invention. While not shown in FIG. 2, it is understood that the input/output pin 10 is connected in parallel to a pair of real or parasitic diodes, a p-type diode and an n-type diode, in a configuration such as illustrated in FIG. 1. While in FIG. 1, the input/output (I/O) pin 10 is shown connected to diodes implemented in MOS-type technology, it will be understood that circuit 50 of FIG. 2 is applicable in other types of technology as well, such as bipolar technology, where the I/O pin is connected in parallel to a p-type diode and an n-type diode, implemented in bipolar technology.

Circuit 50 is a signature circuit employed in a device with I/O pin 10 (device not shown in the figures). After the device has been repaired, circuit 50 is altered to provide an output at pin 10 which is different from the output before the circuit is altered and before device 50 has been repaired. In such manner, circuit 50 enables the device to be tested to see if it is one connected to a device which has been repaired.

Unlike conventional systems where a high voltage is applied to a signature circuit, circuit 50 applies a low voltage to pin 10 to prevent parasitic diode turn-on. As shown in FIG. 2, circuit 50 includes a power supply 52, an enabling circuit 54, and a signature and detecting circuit 56. Power supply 52 supplies power to the device in a test mode in order to test the logic state of pin 10. During the test mode, when the power supply 52 supplies to the enabling circuit a test voltage whose magnitude is below that of any voltage in the operating range of the device, parasitic or real diode turn-on (such as those illustrated in reference to FIG. 1) is prevented. By testing the output of circuit 50, the signature of the circuit can be detected. Preferably an isolation and testing circuit 58 (FIG. 2) is employed to isolate circuit 50 from pin 10 when no testing is performed as described in more detail below.

FIG. 3 is a schematic view of a signature indicating circuit and of an isolation and testing circuit to illustrate one implementation of FIG. 2. As shown in FIG. 3, power supply 52 (not shown in FIG. 3) supplies voltage VCC to the enabling circuit and to the signature and detecting circuits. The enabling circuit includes transistors 62, 64, 66. The signature and detecting circuit includes inverters 72, 74, 76 and fuse 78. After the device (not shown) in FIG. 3 has been repaired, fuse 78 is broken. After fuse 78 has been broken, circuit 50 will be caused to provide a different output in the test mode. Isolation and testing circuit 58 (FIG. 2) includes transistor 92 which, together with the enabling circuit and signature and detecting circuit, causes pin 10 to be substantially unaffected by circuit 50 when circuit 50 is not in a test mode.

The normal operating range of voltage VCC is 5V plus or minus 10%. If power supply 52 (FIG. 2) applies a voltage within the normal operating range to a circuit 50 at VCC as shown in FIG. 3, transistors 62-66 will all be turned on. Node n1 will be at a voltage which is below VCC by the sum of the threshold voltages of transistors 62, 64, where the threshold voltages are typically of the order of 0.5 to 1 volt. Therefore, node n1 will be at a voltage which is approximately 3 to 4 volts (V). Inverter 72 is selected so that its trip point is below 2.5 V. In such event, node n2 will be at logic low, node n3 at logic high, and node n4 at logic low. This causes transistor 92 to be turned off so that pin 10 will be unaffected by circuit 50. Hence when the power supply 52 supplies a voltage within the normal operating range of the device (not shown in any of the figures), isolation and testing circuit 58 (transistor 92) isolates circuit 50 from pin 10 and circuit 50 does not affect pin 10 or the remainder of the device.

When power supply 52 supplies a voltage VCC whose magnitude is below any of that in the operating range of the device, the voltage at node n1 will again be lower than VCC by the sum of the threshold voltages of transistors 62, 64. The magnitude of the voltage VCC applied in the test mode and the trip point of inverter 72 are selected such that, in such circumstances, the voltage of node n1 is below the trip point of inverter 72. In such circumstances, node n2 will be a logic high. Then depending on whether fuse 78 has been broken or not, node n4 can be at either logic high or logic low. If fuse 78 has been broken, node n3 will be at logic low so that node n4 will be at logic high. This turns on transistor 92 to affect the logic state of I/O pin 10. Inverter 74 is a weak pull-down device so that if fuse 78 is not broken, node n3 will be pulled high irrespective of the output of inverter 74. Therefore, if fuse 78 has not been broken, node n3 will be pulled high and node n4 will be low. This turns off transistor 92. This causes pin 10 to be isolated from circuit 50.

In other words, if the device has not been repaired, fuse 78 has not been broken so that node n4 will always be low. However, after fuse 78 has been broken, applying a voltage whose magnitude is below the operating voltage of the device by means of voltage supply 52 will cause node n4 to be high. Hence the testing of the output of circuit 50 at node n4 will give the signature of circuit 50. Circuit 50 therefore provides a means for recording the signature and for testing the signature to distinguish as to whether the device has been repaired or not As also described, by inserting transistor 92 between node n4 and pin 10 as shown in FIG. 3, the logic state of node n4 can be tested in a test mode without adversely affecting pin 10 or the operation of the device when the device is not being tested. The logic state of n4 can be tested by applying a low voltage to pin 10 and testing whether there is any current flow in transistor 92. If there is current, node n4 is at logic high, otherwise it is at logic low.

While a particular implementation of the invention is described above in reference to FIG. 3, it will be understood that various modifications can be made without departing from the scope of the invention. Thus, transistors 62, 64, 92 may all be bipolar transistors instead; in such event, the gate of the transistors corresponding to transistors 62, 64 will be connected to collectors so that again they function as diodes. Transistor 66 may be replaced by a resistor. Inverters 72-76 may be implemented in either MOS or bipolar technologies. While three inverters 72-76 are used to ensure that the output at n4 is at either logic high or logic low and not at a voltage level in between, it is evident that a different number of inverters may be used and is within the scope of the in It is preferable to use two different inverters 72, 74: inverter 72 with an appropriately selected trip point to detect the voltage at node n1 and a weak pull down inverter 74 coupled with fuse 78 to record the signature. Obviously other implementations are possible and are within scope of the invention.

Transistor 66 also pulls down node n1 when the voltage applied by power supply 52 changes from one within the operating range to a voltage whose magnitude is below those of voltages in the range. Thus, if the voltage applied by power supply 52 is 5V and the threshold voltage drops of transistors 62, 64 are each 1 V, the voltage at node n1 is approximately 3 V. This is the case since transistor 66 has a much higher drain-source resistance compared to transistors 62, 64 so that most of the voltage drop from VCC to VSS occurs across transistor 66. If node n1 is separated from transistor 66, then when the voltage supplied by power supply 52 as VCC in FIG. 3 changes to a lower voltage, such as 2 V, the voltage at node N1 would have remained at 3 V. The presence of transistor 66 causes node n1 to be pulled down to ground.

The signature of circuit 50 may be detected at node n4. If desired, a separate pin of the device may be connected to node n4 and dedicated for testing the signature of circuit 50. However, frequently input/output pins of a device are valuable and it is undesirable to use a pin solely for the purpose of testing signatures. In such event, it is desirable to employ an isolation and testing circuit between the output of circuit 50 in FIG. 2 and the I/O pin 10 as shown in FIG. 2. As shown in FIGS. 2 and 3, the isolation and testing circuit of FIG. 2 is implemented by means of transistor 92 whose source is grounded in FIG. 3. Even when power supply 52 is applying a voltage in the normal operating range to the enabling and signature and detecting circuits as shown in FIG. 3, pin 10 is essentially isolated from circuit 50 by transistor 92 in a manner described above.

During the normal operation of the device when it is not tested, node n1 will be at logic high so that transistor 66 is turned on. Hence during the normal operation of the device, transistor 66 will continuously draw current resulting in power loss even in the normal operating mode in which no testing is performed by circuit 50. A low power signature testing circuit where essentially no power is consumed in the operating mode is illustrated in FIG. 4 in the second implementation of the circuit of FIG. 2.

To simplify the description, identical components in FIGS. 3 and 4 are identified by the same numerals. As shown in FIG. 4, when testing is desired, the chip enable signal CE is set to logic high and is applied to the gates of transistors 102, 104 and 106. This causes transistor 102 to be turned off and transistor 104 to be turned on so that the circuit essentially reduces to that in FIG. 3 and functions in essentially the same manner as the circuit of FIG. 3. Thus, during the test mode, transistor 66 is allowed to draw current. Inverters 72, 74 may also draw current. Consequently, when no testing of signatures is desired, the chip enable signal CE is set low, thereby turning on transistor 102 and turning off transistor 104. In such event, transistors 104 and 106 will draw essentially no current. Therefore, unlike the circuit in FIG. 3, transistor 66 in the circuit of FIG. 4 also draws no current in the operating mode. When no testing is desired, signal CE applied to the gate of transistor 106 is low, thereby turning the transistor off. This insures that no current is drawn by transistor 92 to reduce power consumption in a standby mode.

Thus, the effect of setting the chip enable signal high is to disable the circuit.

While the invention has been described and illustrated by reference to specific embodiments, it will be understood that modifications and variations may be made without departing from the scope of the invention. Hence while the implementation of FIG. 4 has been illustrated in MOS technology, it will be understood that it may also be implemented in bipolar technology as well. All such variations are within the scope of the invention which is to be limited only by the limited appended claims.

What is claimed is:

1. A circuit for indicating a signature contained within the circuit, the circuit being employed with a device and indicating the signature at a node common to the circuit and the device, the signature containing information about the device, the device functioning in a normal operating mode when it is powered at a voltage within a predetermined operating range, said circuit comprising:

means for supplying power to said circuit and the device, the power supply means defining a normal operating mode by supplying a voltage in a predetermined operating range and defining a test mode by supplying a test mode voltage which is below any voltage in the predetermined operating range;

signature means for providing a first and a second electrically detectable logic state, the logic states providing information about the device, said signature means being connected to said power supply means;

detecting means for electrically detecting the logic state of the signature means and permitting indication of the logic state of the signature means at the node, said detecting means having an output, wherein during the test mode the detecting means produces a first signal at said output in response to said signature means being in a first logic state and produces a second signal at said output in response to said signature means being in a second logic state, the first signal being distinguishable from the second signal;

means for enabling the signature means and the detecting means to enter into a test mode to thereby permit indication of the logic state of the signature means, where during the test mode the power supply means supplies to the enabling means and the device a test mode voltage which is below any voltage in the predetermined operating range, said enabling means preventing the signature means and the detecting means from entering into a test mode when the power supply supplies a voltage in the predetermined operating range.

2. The circuit of claim 1, and further comprising isolation means being connected to the node and to the detecting means, said isolation means enabling the logic state provided by the signature means to be indicated at the node in the test node and isolating the node from the circuit when the circuit is not in a test mode.

3. The circuit of claim 2, wherein said isolation means includes a transistor.

4. The circuit of claim 3 wherein said transistor is a MOSFET whose drain is connected to the node and whose gate is connected to the detecting means, so that when the circuit is not in the test mode, the output of said detecting means is at a logic state such that said transistor is electrically nonconducting and the node and the device are thereby electrically isolated from said detecting means of said circuit.

5. The circuit of claim 2, further comprising a disabling means to reduce power used by said circuit, wherein said disabling means prevents current flow in said isolation means when the circuit is not in a test mode.

6. The circuit of claim 5, wherein said isolation means includes a transistor and said disabling means includes a transistor whose gate is connected to a control voltage, the isolation transistor being connected to the transistor of the disabling means.

7. The circuit of claim 1, wherein said detecting means has a predetermined trigger voltage, and said enabling means includes at least two diodes which connect the power supply means to the detecting means, such that when the power supply means supplies to the diodes a test mode voltage, said enabling means applies to the detecting means a voltage that is below the predetermined trigger voltage, thereby triggering the detecting means into a test mode, and so that when the power supply means supplies to the diodes a voltage within the predetermined operating range, said enabling means applies to the detecting means a voltage that is above the predetermined trigger voltage, thereby triggering the detecting means to produce an output signal which causes the node to be electrically isolated from said circuit.

8. The circuit of claim 7 wherein said enabling means further comprises means for pulling down the voltage level of the output of the enabling means when the voltage supplied by the power supply means decreases from a voltage in the normal operating mode to one in the test mode.

9. The circuit of claim 8, wherein said pulling down means includes a transistor.

10. The circuit of claim 8, further comprising a disabling means to reduce power used by said circuit, said disabling means comprising means for pulling up the voltage level of the enabling means output and for disabling the pulling down means when the circuit is not in a test mode.

11. The circuit of claim 10, wherein said pulling up means includes a transistor and wherein said means for disabling said pulling down means includes a transistor.

12. The circuit of claim 7 wherein said detecting means includes an inverter whose input is connected to the output of the enabling means, and wherein the trip point of said inverter defines the predetermined trigger voltage of said detecting means.

13. The circuit of claim 1, wherein said detecting means includes buffer means for improving the signal levels of said detecting means.

14. The circuit of claim 13, wherein said buffer means includes an inverter.

15. The circuit of claim 13, wherein said signature means includes fuse means which is programmable into said first logic state by being broken and into said second state by being left intact, thereby setting the logic state of the signature means.

16. The circuit of claim 15, wherein said buffer means includes a first, a second, and a third inverter connected in series in such order, said first inverter receiving a voltage input signal from the output of the enabling means and the third inverter applying its output to the node, wherein said fuse means is connected to a second node between the output of the second inverter and the input of the third inverter.

17. The circuit of claim 16 wherein during the test mode the output of said second inverter at said node is a logic high when said fuse means is intact, and the output at said node is a logic low when said fuse means has been broken.

18. The circuit of claim 15 wherein said fuse means of said signature is in said first logic state if the device has not been repaired and is in said second logic state if the device has been repaired.

* * * * *